United States Patent [19]

Smith

[11] 4,211,893
[45] Jul. 8, 1980

[54] DUAL MODE MUSIC INSTRUMENT AMPLIFIER

[75] Inventor: Randall C. Smith, Lagunitas, Calif.

[73] Assignee: Mesa Engineering, Inc., Lagunitas, Calif.

[21] Appl. No.: 959,705

[22] Filed: Nov. 13, 1978

[51] Int. Cl.² .............................................. G10H 1/06
[52] U.S. Cl. .................................. 179/1 A; 84/1.16; 330/149
[58] Field of Search ............... 330/149; 84/1.11, 1.16, 84/1.19; 179/1 A, 1 M

[56] References Cited

U.S. PATENT DOCUMENTS

| | | | |
|---|---|---|---|
| 2,315,248 | 3/1943 | De Rosa | 179/1 D |
| 3,673,304 | 6/1972 | Dudas | 84/1.16 |
| 3,835,409 | 9/1974 | Laub | 330/149 |
| 3,860,876 | 1/1975 | Woods | 328/167 |
| 3,973,461 | 8/1976 | Jahns | 84/1.19 |
| 4,150,253 | 4/1979 | Knoppel | 84/1.19 |

*Primary Examiner*—James W. Moffitt
*Assistant Examiner*—Randall P. Myers
*Attorney, Agent, or Firm*—Jay M. Cantor

[57] ABSTRACT

An electronic amplifying apparatus intended for electric music instruments (primarily guitar), with switchable circuitry offering an improved, specialized circuit for the enhancement of solo playing in addition to customary simple amplification. In the lead (or solo) mode of operation, the circuit will synthesize particular sustain and distortion characteristics and add them to the tone of the instrument (guitar, electric piano, microphone, etc.) to produce a more flexible and expressive sound for solo playing than the sound of the instrument normally amplified. Switching and control circuitry enable the musician to return to a conventional amplified tone which would be preferred for rhythm (or chordal) playing.

12 Claims, 5 Drawing Figures

DUAL MODE MUSIC INSTRUMENT AMPLIFIER

FIELD OF INVENTION

This invention relates to electronic amplifier systems for musical instruments which also provide specialized circuitry for enhancement of sound produced by a sole instrument.

PRIOR ART

Electronic amplifying circuitry specifically designed for musical instrument amplification is well known and in use. Further, such circuitry may include switchable features to modify or enhance the tone of an instrument, vibrato and reverberation being common examples. One way of modifying and distorting the tonal quality of audio frequency signals generated by musical instruments, is to overdrive an electron discharge device of one of the stages of an amplifier to provide a non-linear output. Such an arrangement is disclosed by the patent to DeRosa U.S. Pat. No. 2,315,248. A further teaching is provided by the patent to Jahns 3,973,461 who utilizes a cathode follower as the distortion stage to which the audio frequency signals are applied.

The tube utilized as the cathode follower is biased to normally operate in a linear mode at normal signal levels but is driven sufficiently hard to provide distortion at its output by increasing the signal level at its input and decreasing the signal level at its output in order to maintain a predetermined normal output level. The signals applied to the input of the distortion amplifier are also adjustably added to its output. However, if only clean, undistorted signals or only the distorted signals are selected to appear at the output by cutting out the other of the signals, the signal level at the output varies accordingly and must be adjusted at each selection in order to maintain a given output level.

BRIEF DESCRIPTION OF THE INVENTION AND OBJECTS

In my amplifying circuitry, a plural control configuration can be remotely switched into operation which, with its input and output level controls adjusted, will give greatly improved lead instrument tonality providing sustain and distortion characteristics which are now part of lead instrument expression in the popular and blues music millieu and which have been previously partially attainable only by exceeding the designed power parameters of the output stage in conventional amplifiers.

A double-pole-double-throw (DPDT) switching relay is operable by either a front panel switch or remote push button to select either the conventional amplification mode or to activate the lead drive circuitry. Following initial pre-amplifier and tone control circuitry and a volume control, signal output from a low impedance cathode follower stage is a relay selected to couple through a pre-amplifier output level control to the power amplifier driver stage for conventional amplifying purposes. In the lead mode (with the relay activated) a signal from the low impedance source is instead coupled through a separate lead drive control into an additional high gain amplifying stage. The output level of this stage is regulated by a final control or lead master. The overall amplifier gain in the lead mode can be up to 50 or more times the amplification factor of the circuit in the conventional mode. This provides massive saturation of the lead drive and/or successive stages to generate a composite signal where as much as half or more of the signal content may be distortion products (mostly of the even harmonic order together with a substantial amount of the odd harmonics). With the added gain, string vibration at the instrument (electric guitar) may decay by 90% or more without effectively changing the tone of the volume produced by the circuit (the resulting musical tone sounds not so much like a plucked string as a bowed string.) The lead drive control regulates the amount of distortion and sustain; the lead master attenuates the output level so that the playing loudness in the lead mode is separately adjustable from the playing loudness in the conventional rhythm mode.

DETAILED DESCRIPTION OF PREFERRED EMBODIMENTS

Figure 1:
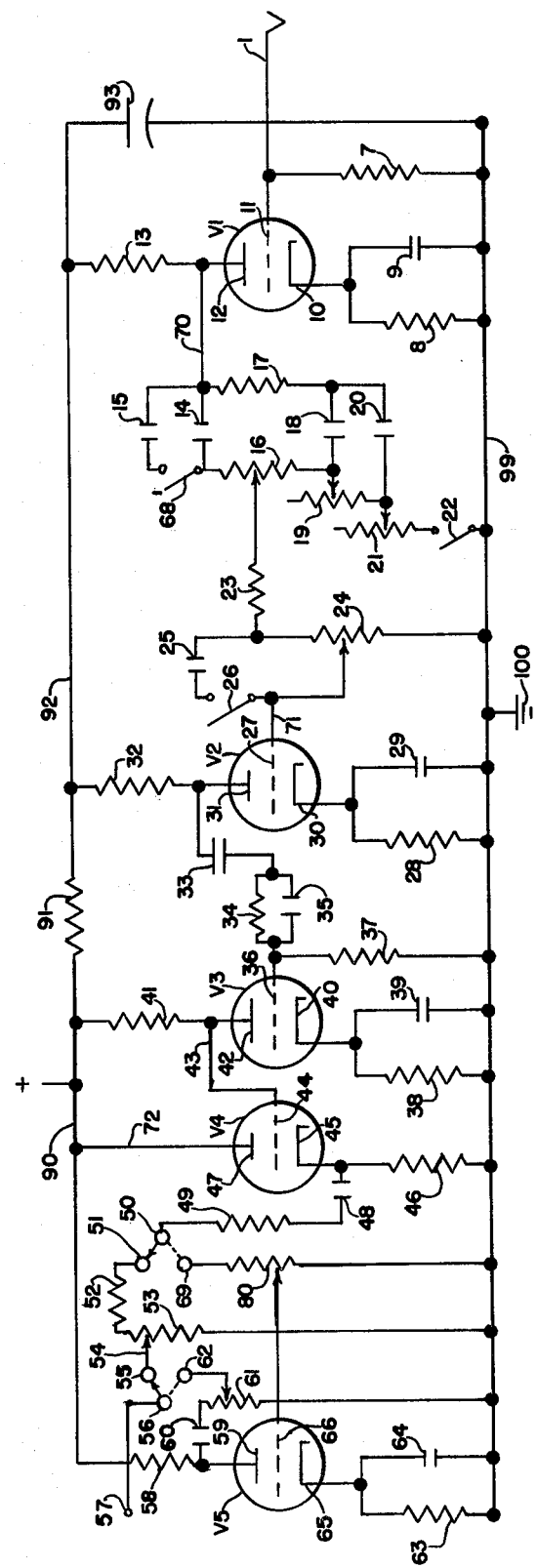
FIG. 1 is a schematic circuit diagram of a basic embodiment of this invention.

My improved dual mode music instrument amplifier circuit is shown in the drawings as utilizing triodes, identified as V1, V2, V3, V4 and V5 for the plural stages of the amplifier. It will be understood however, that any multi-element vacuum tube or semi-conductor may be utilized for this purpose.

Figure 3:
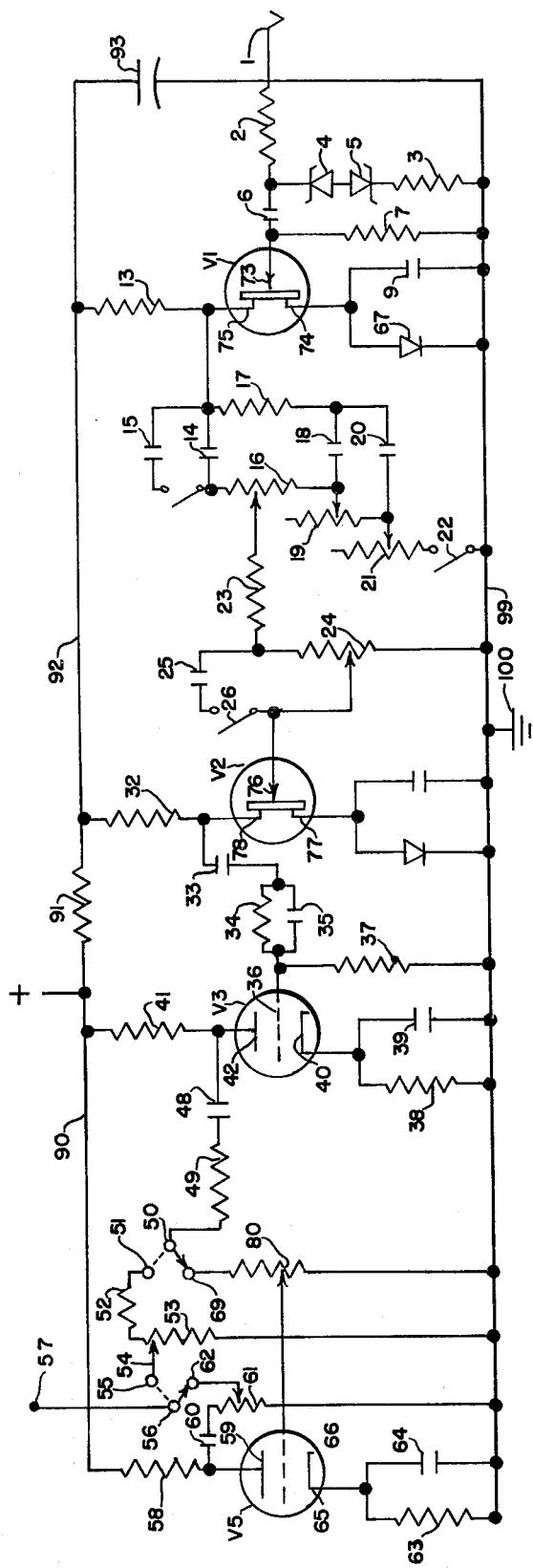
FIG. 3 is a schematic circuit diagram identical to that of FIG. 2 except that the direct coupled cathode follower stage V4 has been omitted.

In. FIG. 1 the input circuit is evidenced by the conductor 1, leading to the grid 11, of V1. The grid leak resistor 7, connects to the common 99, which is grounded at ground 100. The amplifier stage V1 is conventionally arranged with the cathode bias resistor 8 and bypass capacitor 9 between the cathode 10 and common 99. The plate 12 of V1 is connected to the B+DC high voltage supply 92 through load resistor 13. Amplified output from V1 is fed by conductor 70 to the tone control network comprising components 14 through 23 and component 68. The treble control 16, is in a tee formation. The treble RC network consists of the potentiometer 16 and the capacitor 14. Treble control center point frequency shift can be accomplished by means of the switch 68' (called treble shift), which introduces more capacitance 15 into the RC network. Potentiometer 19 is the base tone control and works in conjunction with capacitor 18. Potentiometer 21 is the middle frequency tone control whose RC network includes capacitor 20. Resistor 17 is used to obtain a balance in the outputs of the base and middle RC networks relative to the output of the treble RC network. SPST switch 22 deactivates the tone control network when open and, as this eliminates a substantial loss of gain caused by the tone control network, the switch is called the gain boost. Resistor 23 conducts the signal to potentiometer 24, known as the Volume 1 control. The resistor 23 prevents loading of the tone control circuit when Volume 1 (24) is set low. The bright switch 26 activates capacitor 25 to compensate for treble frequency attenuation at low settings of Volume 1 (24). V2 is another conventional amplifier stage. Its grid 27 receives the signal from the control 24 (and possibly from the bright switch) via conductor 71. The cathode 30 of V2 is biased by resistor 28 and bypassed by capacitor 29. The plate 31 of V2 is fed from the B+ supply through load resistor 32. The blocking capacitor 33 couples the output of V2 to the grid 36 of V3 through an RC network used for tone shaping comprising resistor 34 and capacitor 35. Resistor 37 serves as the grid leak for V3. The V3 cathode 40, is also conventionally biased through resistor 38 and bypassed to ground via capacitor 39. Plate 42 is connected to B+ supply 90 through load resistor 41. The signal output of V3 is direct coupled to the grid 44 of stage V4 by a conductor 43. The plate 47 of V4 is connected directly to the B+ supply by conductor 72. The cathode 45 is biased by resistor 46 and the output of the V4 cathode follower stage is coupled via capacitor 48 and resistor 49 to the first pole 50 of the DPDT status relay. It should be noted at this point that the cathode follower stage V4 contributes only a slight enhancement of musical characteristics and may be omitted without severely affecting the overall performance of this preamplifier. Such a circuit is shown in FIG. 3. The first segment of the DPDT relay consists of input contact pole 50 and output contact throws 51 and 69 which perform half of the selection between normal and lead amplification modes. In this normal (relay de-activated) position, a signal is conducted by the relay from point 50 to point 51. Resistor 52 couples the signal into potentiometer 53 which is the Master 1 control. Output from this control reaches contact 55 of the second segment of the DPDT relay via conductor 54. As shown in the drawings, the pole segments of the status relay are coordinated so that the signal is conducted to the pre-amplifier output termination 57 via relay contacts 55 and 56 when the signal is present at Master 1 control 53, as selected by contacts 50 and 51 of the preceding relay segment. Thus, the amplifier circuit comprising V1, V2, V3 and V4 can be adjusted via the Volume 1 control 24, and the Master 1 control 53 to furnish an appropriate amount of gain to the power amplifier to which the signals are applied to allow normal and faithful amplification of an electric musical instrument. Distortion is low and the output sound develops a musical richness due to the processing it receives and due to the plurality of stages, even in the rhythm mode, as V1 and V2 alone are easily capable of supplying sufficient drive to most power amplifier circuits.

When the relay is activated (relay position shown by dashed lines), the amplifier is switched into the sole mode primarily by the inclusion of V5. When activated, the relay conducts a signal from the output of V4 across the points 50 and 69 to a potentiometer 80 known as the lead drive. The lead drive 80 controls the amount of signal arriving at the grid 66 of V5. This signal voltage can be many times the allowable headroom or grid driving voltage of V5 so that the lead drive control 80 adjusts the amount of saturation overdrive, and hence the added harmonic distortion content typical of the desired lead solo sound. V5 is operated as a conventional plate loaded amplifier, and is biased to operate about the midpoint of the linear portion of its characteristic. The signals applied to its grid from the perceding amplifier stage are of such large amplitude that both the positive and negative excursions thereof drive the tube to operate in the non-linear portions of its characteristic. There is thus obtained at its output distorted signals rich in both even and odd harmonics. Its cathode 65 is biased by resistor 63 and is bypassed to ground by capacitor 64. Load resistor 58 connnects the plate 59 with the B+ supply 90. Output is taken from the plate and coupled by capacitor 60 to a potentiometer 61, known as the lead master. The lead master potentiometer 61 operates to control the overall system loudness in the lead or solo mode of operation and this attenuated output appears at the pre-amplifier termination 57 after being conducted across the relay contact points 62 to 56. Resistor 91 is used in the B+ supply line to lower the voltage slightly for the field effect transistor drain elements where they are used (as in FIG. 2), and to decouple these input stages from the following stages. Capacitor 93 is an electrolytic filter type which completes the decoupling and prevents oscillation to high gain settings.

This adaptation of the circuit in FIG. 1 is designed and constructed such that the active elements of V1 and V2 can be either dual triode vacuum tubes or high voltage field effect transistors which are available as dual units in a nine-pin plug-in package, and are directly interchangeable with the tube. It should be further understood that field effect transistors could be substituted in a similar fashion in any or all of the amplifier stages and also that NPN or PNP bipolar transistors could be employed in a switchable circuit using the same overdrive principles, although the harmonic distortion products of this device is less well suited.

Figure 2:
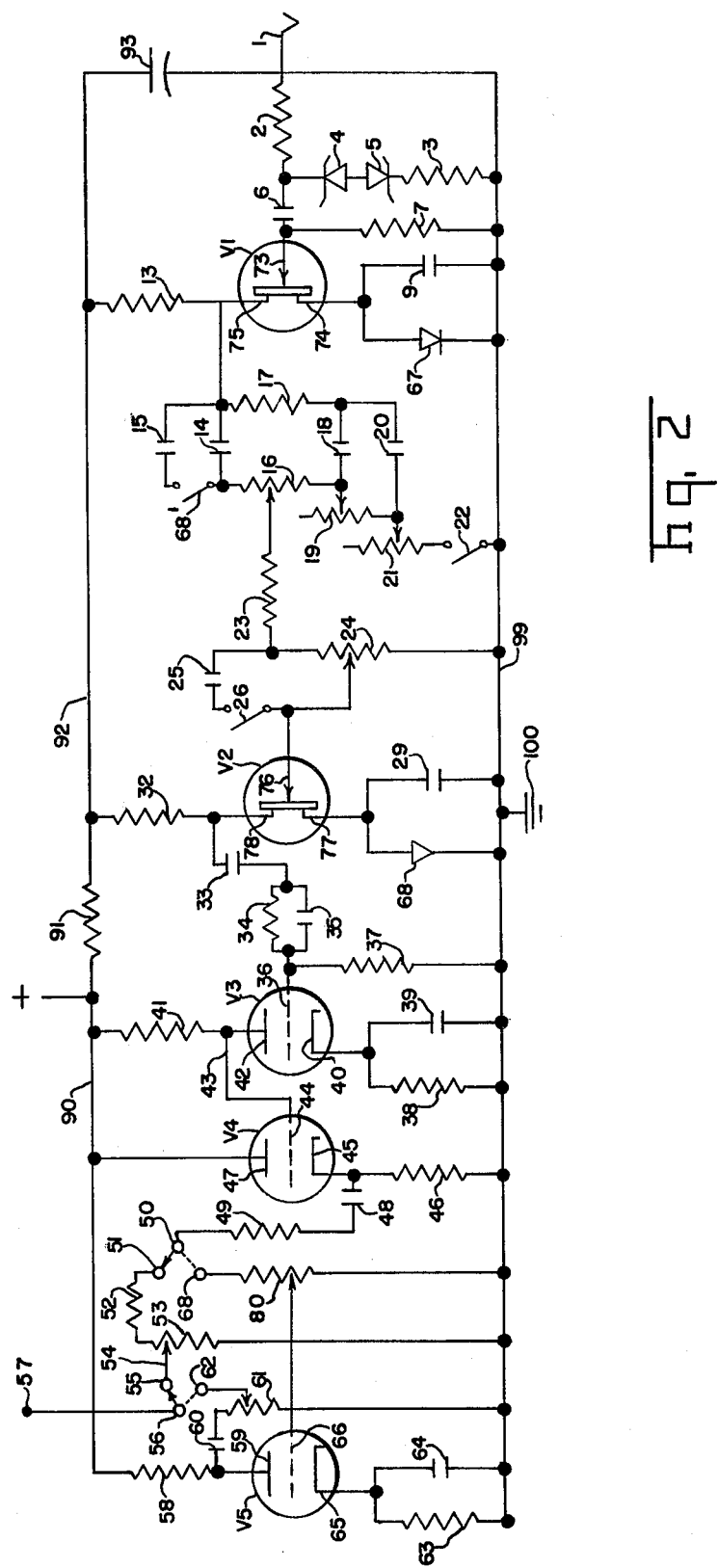
FIG. 2 is a schematic circuit diagram of another embodiment of the invention using high voltage field effect transistors in the first two stages.

FIG. 2 shows an adaptation of the circuit which allows the use of field effect transistors in the first two stages, V1 and V2. This modification, as noted, allows for direct plug-in replacement of the dual triode electron tube by the properly packaged dual high voltage FET and, similarly, in case of damage or failue, the FET may be replaced by a conventional dual triode. This direct interchangeability of vacuum tube and solid state devices in the critical input stages constitutes another embodiment of my invention. It should be noted that the dual mode and overdrive saturation principles of my invention could be achieved by any combination of vacuum tubes, FETs, or bipolar transistors at V1,V2,V3,V4 and V5. The electron tube elements labeled in FIG. 1 have their equivalent counterparts in the FET elements of FIG. 2; i.e. for V1 the grid 11 is counter to gate 73, cathode 10 is counter to source 74, plate 12 is counter to drain 75, and similarly for V2 the gride 27 is counter to gate 76, cathode 30 is counter to source 77, and plate 31 is counter to drain 78. Deviations from the circuit diagram of FIG. 1 are the constant current course diodes (element 67 for V1, element 68 for V2) which regulate bias and therefore maintain operational stability for the FETs over a wide range of temperature, and further prevent drift from FET aging. These are bypassed to ground by the same capacitors 9 and 29 which appear in FIG. 1. The other deviations of FIG. 2 from FIG. 1 constitute the input protection system required by the FET comprising parts 2 through 6. The resistors 2 and 3 comprise a voltage divider to protect senser diodes 4 and 5 from burn out in the event a high voltage high power signal is applied to the preamplifier input turning the zeners on into conduction. The zener diodes themselves, 4 and 5, limit the amount of voltage which can appear at the FET gate to a predetermined level and prevent damage of the FET due to ground loops or misuse of the amplifier. Capacitor 6 further protects the FET by blocking any DC leakage which may appear superimposed on the input signal.

FIG. 3 shows another embodiment of the circuits shown in FIG. 1 and FIG. 2, namely omission of the cathode follower stage V4. As previously noted, this omission does not substantially alter the principle or performance of the pre-amplifier, and may be justified economically in circumstances which would require the addition of another tube, socket, shield and peripheral wiring for its inclusion. If an otherwise unused triode is available (as may be the case where reverberation is added to the pre-amplifier) the inclusion of the V4 cathode follower to the circuit makes the output of my pre-amplifier slightly smoother sounding in the lead mode and somewhat richer sounding musically in the conventional amplifying mode of operation. The circuit of FIG. 3 shows the coupling capacitor 48 connected to the plate of V3 instead of the cathode of V4 as in FIG. 2. Otherwise the circuits of FIG. 2 and FIG. 3 are identical.

Figure 4:
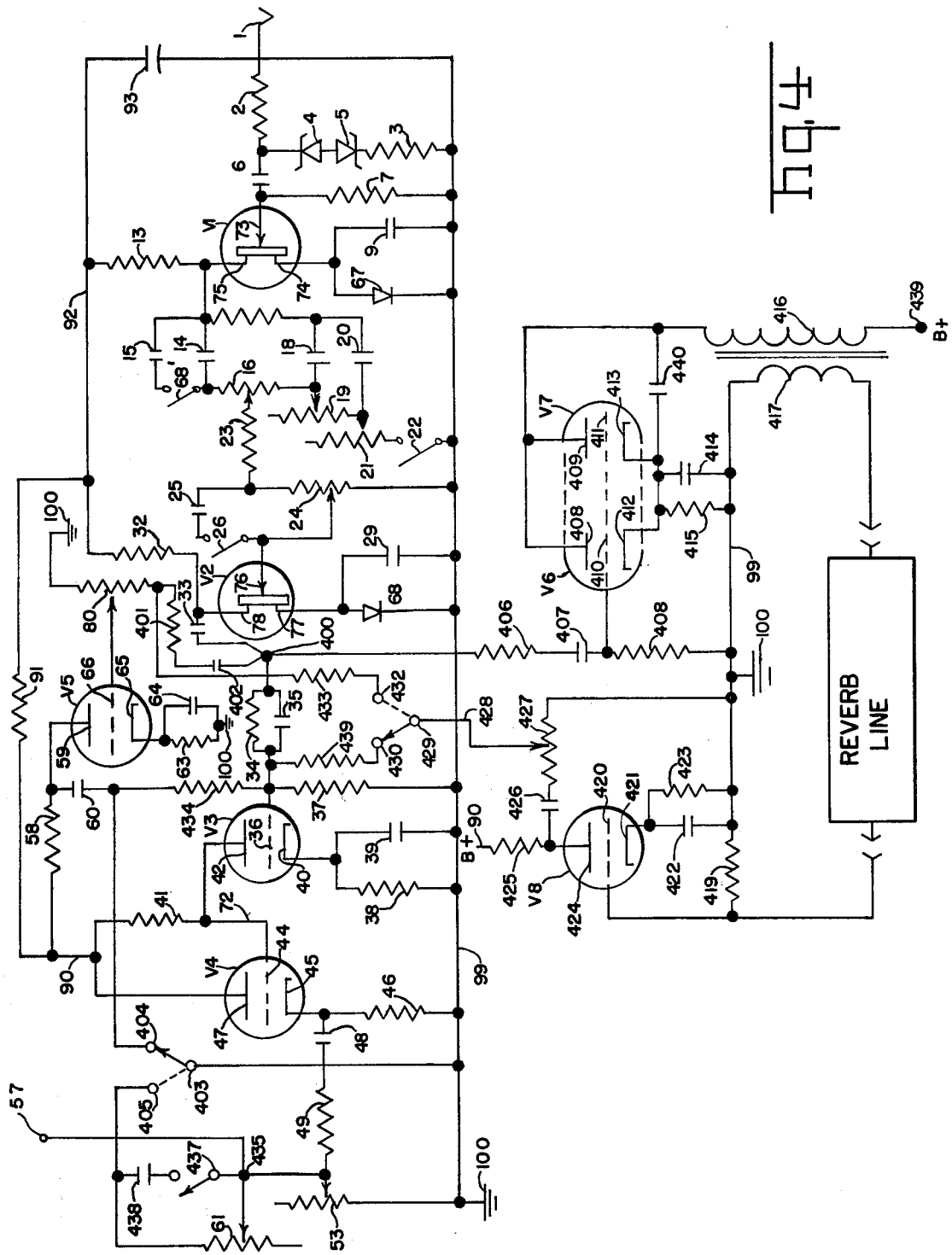
FIG. 4 is a schematic circuit diagram showing a modified arrangement of the circuit elements enabling reverberation to be added to the amplifier.

FIG. 4 is a schematic diagram which shows the dual mode music instrument pre-amplifier with the addition of reverberation. This entails a somewhat different arrangement of the same basic circuit elements as previously described in order to maintain a proper reverberation function in both solo and rhythm modes of operation. Up until the output of the V2 stage, the circuit is identical with that described and shown in FIG. 2, and it will be further seen that many other elements of the FIG. 2 circuit appear here in FIG. 4 with the same functions as performed previously although the sequence of the stages and the function of the relay vary somewhat. The output of the V2 amplifier stage, then, is coupled by capacitor 33 to a junction point 400. Here a signal is coupled to the V3 grid 36 through the familiar RC network comprising resistor 34 and capacitor 35. Also fed from the junction point 400 are the overdrive stage V5' and the reverberation drive stage V6, V7. Capacitor 402 and resistor 401 couple the signal from point 400 to the grid 66 of V5'. The lead drive control 80 attenuates the signal and hence overdrive distortion produced by the V5' amplifying stage. Circuit components, 58, 59, 60, 63, 64, 65 and 66 of V5' remain identical to those as described under FIG. 2. The relay, however, is arranged differently. The center pole 403 of one relay segment is connected to ground 100. In the rhythm mode of operation, the V5' overdrive stage is de-activated by virtue of its signal being shunted to ground via the relay from contact 404. The low gain signal is conducted from junction 400 to the grid 36 of stage V3 by the RC network comprising resistor 34 and capacitor 35. Resistor 434 reduces loading at the grid 36 of V3 to a neglibible amount when the amplifier is in the rhythm mode and the output signal of V5' is shorted to ground. When the relay is activated (shown by dashed lines) the ground shunt is removed, allowing the adjustable high gain output of V5' and its Class A triode distortion products to be coupled into the grid 36 of V3 by resistor 434. V3 and its associated circuit parts are identical in description and operation to those of V3 in FIG. 2. The output of the V3 amplifier is direct coupled to V4, again, exactly as previously described under FIG. 2. The low impedance cathode follower output of V4 is coupled by capacitor 48 and resistor 49 to the Master 1 control 53. The output of the Master 1 control constitutes the final amplifier output 57 as in FIG. 2. For the sake of clarity, consider that the amplifier output 57 is common with (or connected to) a junction point 435. Also tied to this output junction point 435, 57 is the wiper or adjustable leg of the lead master control 61. When the mode selecting relay is activated (dashed lines) and the ground shunt is removed from the output of V5', that same ground shunt 403, 100 is applied to one end of the lead master potentiometer 61 via relay contacts 405 and 403. This ground shunt activates the lead master control 61, causing it to override the master 1 control 53 and allowing a pre-settable attenuation of the now boosted amplifier output as it arrives at the output junction 435, 57 from cathode follower stage V4. An additional feature is a high-frequency-cut switch 437 which bypasses upper treble and harmonics to ground through capacitor 438. A virtue of this high-cut switch is that it has no effect on the rhythm signal tonality because capacitor 438 can only drain to ground when the relay is selecting the lead mode of operation. Therefore, if the musician wishes to select a bright, treble chording sound, he can prevent his lead tone from being too bright and thin by the use of the high-cut switch 437.

From the junction point 400, the signal is also coupled into the reverberation driver amplifier V6-V7 through capacitor 407 and mixing/isolation resistor 406. The reverberation driver amplifier shown is a dual-parallel-triode transformer coupled Class A output amplifier comprising V6, V7 and associated components. The grids 410, 411 use resistor 408 for grid leak to ground 100. The two cathodes 412, 413 are biased by resistor 415 and bypassed by capacitor 414 to ground 100. The two cathodes 412, 413 are biased by resistor 415 and bypassed by capacitor 414 to ground 100. The plates 408, 409 are connected through the primary winding 416 of a small output transformer to the B+ high voltage 439. Spurious oscillation is eliminated by neutralizing capacitor 440 between the plates 408, 409 and the cathodes 412, 413. The secondary winding 417 of the output transformer couples the signal into a three-spring electro-mechanical reverberation delay line 418. The grid 420 of the reverberation return pre-amplifier V8 is fed from the output of the spring delay line 418 and uses for grid leak a resistor 419 connected to ground 100. V8 is a conventional high gain Class A amplifier whose cathode 421 is biased by resistor 423 and bypassed by capacitor 422. A plate load resistor 425 connects the V8 plate 424 to the B+ voltage supply 90. Amplified reverberated signal is taken from the plate 424 of V8 through coupling capacitor 426 to one end of the reverb intensity control 427, the other end of this control being grounded. The adjustable reverberation signal is taken from the variable leg of the reverberation control 427 and fed to the remaining segment of the DPDT relay via conductor 428. This segment of the relay, comprising input pole 429 and output contacts 430 and 432 assigns the reverberated signal to the appropriate circuit points so that a proper ratio of reverberated and real-time signals is maintained in both modes of amplifier operation. With the amplifier in the rhythm mode (as shown) the reverberation signal is conducted across relay points 429 to 430 and through mixing/isolation resistor 439 where it joins with the low gain signal from the RC network of 34 and 35 to feed the grid 36 of V3. When the relay is activated (dashed lines) and the amplifier is in the lead mode, the reverberation signal is instead conducted across relay points 429 to 432 and through mixing/isolation resistor 433 to the grid of the now activated V5' overdrive amplifier. Thus, as the real-time signal is processed by the V5' stage and may attain up to another 50 or more times amplification, the reverberated signal is likewise amplified so that a fairly constant amount of reverberation is maintained in both modes of amplifier operation.

The relative location of the switchable overdrive stage V5 has been changed to accommodate proper mixing of the reverberation (delay/decay) signal in both solo and rhythm modes of operation and has been identified as V5'. In the circuit of FIG. 4, it will be seen that one segment of the DPDT control relay is used to switch in the plural control overdrive stage V5', while the other segment is used to assign amplified signal returning from the reverberation delay line. This output from the reverberation system remains constant whether the amplifier is in the rhythm or lead mode, and in order to maintain a proper ratio of real-time signal to reverberation delay signal in both modes. Output from the reverberation circuit must be mixed into the overdrive stage V5' when the relay is activated and the lead mode selected.

Figure 5:
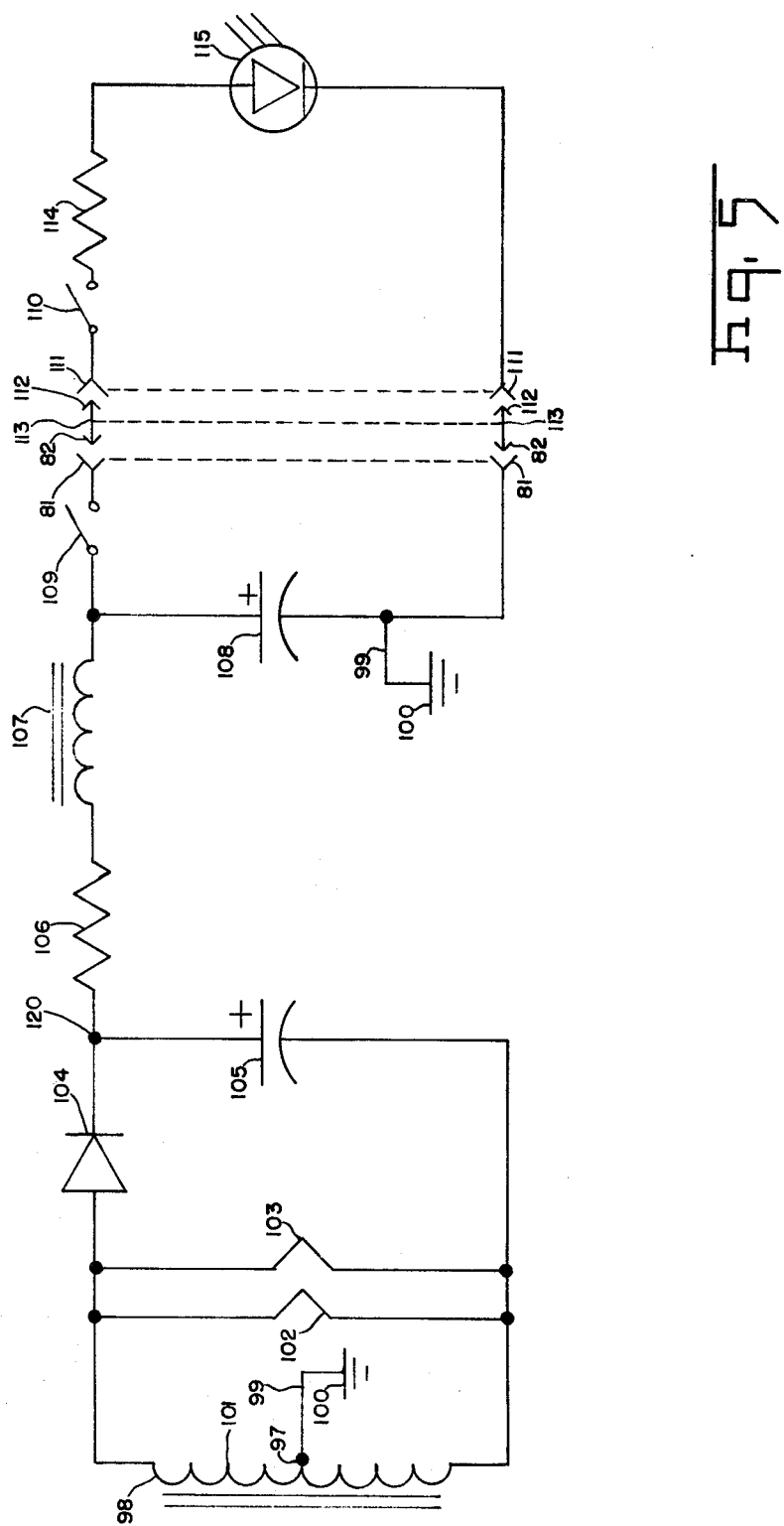
FIG. 5 is a schematic diagram showing another feature of my invention, namely the power supply circuitry for the relay, including local and remote switching features and a status indicator showing which mode of amplifier operation is currently selected.

FIG. 5 is a schematic diagram showing an embodiment of this invention, namely the relay power supply and switching system which enables the amplifier to change back and forth between conventional amplification and the lead mode operation. In this diagram, the power transformer 98, has a 6.3 volt filament winding 101, with a center tap 97, connected to a common ground 99, 100. Vacuum tube filaments are represented at 102 and 103, and there may be several. A silicon diode 104 rectifies one leg of the AC line during its positive half-cycle. An electrolytic capacitor 105 stores energy while the diode 104 conducts and also passes voltage to a common point 120 when the other leg of the AC line goes positive and the diode is momentarily shut off. Resistor 106 limits the amount of current which can be drawn by the relay activation coil 107. Another electrolytic capacitor 108 shunts transients to ground and prevents audible popping noise in the amplifier when the relay is tripped. A single-pole-single-throw switch 109 is located on the amplifier front panel for local relay control and as a fail-safe. A pair of jacks 11 and 81 and plugs 112 and 82 allow connection of a cable 113 to a remote push-button SPST switch 110. An LED status indicator 115, mounted on the switch housing, is attached by a current limiting resistor 114 between the positive relay activating voltage and ground. When the switch 110 is closed, the relay voltage drops below the level needed to excite the LED.

In considering this invention, it should be remembered that the present disclosure is intended to be illustrative only and the scope of the invention should be determined by the appended claims.

What is claimed is:

1. An electronic amplifier for audio frequency electrical signals generated by a musical instrument such as a guitar including a plurality of preamplifier stages operating in substantially the linear mode and providing a high amplitude signal output from the final pre-amplifier stage,
    a further amplifier stage comprising an electron discharge device having an anode, a cathode and a control electrode,
    a first adjustable attenuation network,
    a second adjustable attenuation network,
    a pre-amplifier signal output terminal,
    switch means for selectively coupling the output of the final pre-amplifier stage to the pre-amplifier signal output terminal through the first network to provide a signal having a preset amplitude to said terminal or coupling the final pre-amplifier stage to the control electrode to drive it into its non-linear saturated operating mode to provide a distorted signal at its anode electrode,
    and said switch means including means operating to couple the output from said anode electrode to the pre-amplifier signal output terminal through said second network concurrently with the coupling of the control electrode to the output of said final pre-amplifier stage.

2. An electronic amplifier according to claim 1 further including a third attenuation network for adjusting the signal level applied to the control electrode.

3. A circuit for enhancing sound generated by a musical instrument such as a guitar and which is converted into electrical signals comprising,
    an electronic amplifier having an input terminal for receiving said signals and including a plurality of amplifier stages,
    one of said stages, except the initial stage, being operated as a distortion amplifier stage and which comprises an electron discharge device having an anode, a cathode and a control electrode,
    the amplifier stage preceding said one stage providing a signal output which, when coupled to the control electrode of said one stage, is of such magnitude as to drive said one stage into saturation to operate in its regions of non-linearity in order to provide a distorted signal rich in harmonics at its anode electrode,
    an output terminal,
    a first adjustable attenuation network,
    a second adjustable attenuation network,
    signal transmission means including switch means for alternately coupling the output from said one stage to said output terminal through said first network and the output from said preceding amplifier stage to said output terminal through said second network, whereby the levels of the respective signals from said one stage and preceeding amplifier stage as applied to the output terminal are preset.

4. A circuit according to claim 3 including a reverberation circuit having its input coupled to the output of said preceeding amplifier stage, and
    means for alternately coupling its output to said control electrode and to the input of said signal transmission means.

5. A circuit according to claim 4 including a third adjustable attenuation network coupled between the output of said preceding amplifier stage and said control electrode.

6. A circuit according to claim 5 wherein the output of said reverberation circuit is coupled to the control electrode through said third network.

7. A circuit according to claim 3 including a third adjustable attenuation network coupled between the output of said preceding amplifier stage and said control electrode.

8. A circuit according to claim 7 wherein said electron discharge device is biased to operate substantially about the midpoint of the linear portion of its characteristic, the signals from the preceding amplifier stage being of such magnitude that both the positive and negative excursions of the signals cause the electron discharge device to operate in the non-linear portions of its characteristics.

9. A circuit according to claim 3 wherein said electron discharge device is biased to operate substantially about the midpoint of the linear portion of its characteristic, the signals from the preceding amplifier stage being of such magnitude that both the positive and negative excursions of the signals cause the electron discharge device to operate in the non-linear portions of its characteristics.

10. A circuit according to claim 9 including a reverberation circuit having its input coupled to the output of said preceeding amplifier stage, and
   means for alternately coupling its output to said control electrode and to the input of said signal transmission means.

11. A circuit according to claim 10 including a third adjustable attenuation network coupled between the output of said preceding amplifier stage and said control electtrode.

12. A circuit according to claim 11 wherein the output of said reverberation circuit is coupled to the control electrode through said third network.

* * * * *